United States Patent
Pasqua et al.

(10) Patent No.: US 11,418,107 B2
(45) Date of Patent: Aug. 16, 2022

(54) BROWN-OUT PROTECTION CIRCUIT FOR A SWITCHING CONVERTER AND METHOD FOR CONTROLLING A SWITCHING CONVERTER

(71) Applicant: STMicroelectronics S.r.l., Agrate Brianza (IT)

(72) Inventors: Alfio Pasqua, Piedimonte Etneo (IT); Salvatore Tumminaro, Marianopoli (IT); Igor Lisciandra, Castelvetrano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 79 days.

(21) Appl. No.: 17/020,184

(22) Filed: Sep. 14, 2020

(65) Prior Publication Data
US 2021/0099074 A1 Apr. 1, 2021

(30) Foreign Application Priority Data

Sep. 27, 2019 (IT) .......................... 102019000017312

(51) Int. Cl.
| | |
|---|---|
| *H02H 3/247* | (2006.01) |
| *H02M 1/32* | (2007.01) |
| *G01R 19/165* | (2006.01) |
| *H02H 3/20* | (2006.01) |
| *H02M 3/335* | (2006.01) |
| *H03K 5/24* | (2006.01) |
| *H02M 1/00* | (2006.01) |

(52) U.S. Cl.
CPC ........ *H02M 1/32* (2013.01); *G01R 19/16538* (2013.01); *H02H 3/207* (2013.01); *H02H 3/247* (2013.01); *H02M 3/33576* (2013.01); *H03K 5/24* (2013.01); *H02M 1/0032* (2021.05)

(58) Field of Classification Search
CPC ......... H02H 3/247; H02H 3/207; H02M 1/32; H02M 3/33576; G01R 19/16538; H03K 5/24
See application file for complete search history.

(56) References Cited

U.S. PATENT DOCUMENTS

| | | | | |
|---|---|---|---|---|
| 4,031,463 A | * | 6/1977 | Norberg | ................. G01R 19/04 324/76.16 |
| 2009/0141523 A1 | | 6/2009 | Sugawara | |
| 2009/0268488 A1 | | 10/2009 | Fujii | |
| 2017/0033788 A1 | | 2/2017 | Fujii | |
| 2018/0088651 A1 | * | 3/2018 | Su | ............................ G06F 1/28 |

\* cited by examiner

*Primary Examiner* — Harry R Behm
(74) *Attorney, Agent, or Firm* — Slater Matsil, LLP

(57) ABSTRACT

In an embodiment, a brown-out protection circuit includes: a monitoring terminal; a threshold generator supplying a threshold voltage; a comparator to compare a monitoring voltage at the monitoring terminal and the threshold voltage; and a logic module supplying an enable signal having a brown-in logic value and a brown-out logic value. When the enable signal is at the brown-out logic value, the logic module checks transition conditions, relating to a number of usable transitions of the monitoring voltage from lower to greater than the threshold voltage, and time conditions, relating to permanence of the monitoring voltage above the threshold voltage after a usable transition or in an aggregated manner after a plurality of consecutive usable transitions. The logic module sets the enable signal to the brown-in logic value when the transition conditions or the time conditions are met.

20 Claims, 8 Drawing Sheets

BROWN-OUT PROTECTION CIRCUIT FOR A SWITCHING CONVERTER AND METHOD FOR CONTROLLING A SWITCHING CONVERTER

CROSS-REFERENCE TO RELATED APPLICATIONS

This application claims the benefit of Italian Patent Application No. 102019000017312, filed on Sep. 27, 2019, which application is hereby incorporated herein by reference.

TECHNICAL FIELD

The present disclosure relates generally to an electronic system and method, and, in particular embodiments, to a brown-out protection circuit for a switching converter and to a method for controlling a switching converter.

BACKGROUND

It is known that many AC/DC converters for switching power supplies implement a supply voltage monitoring function called "brown-in/brown-out" function. This function has the purpose of inhibiting and allowing the switching of the converter when the supply voltage respectively falls below a disable threshold or brown-out threshold and rise above an enable or brown-in threshold. Enabling and disabling are not immediate, in order to avoid spurious state transitions, but occur if certain conditions persist for safety time intervals (also called debounce intervals). The conditions generally include permanence of the supply voltage above an enable threshold (or a brown-in threshold) or below a disable threshold (or a brown-out threshold) for times greater than, respectively, an enable time and a disable time. However, the simple use of safety time intervals is not sufficient to guarantee that the transitions between brown-out and brown-in states occur satisfactorily.

For example, the transition to the brown-out state, which in practice abruptly interrupts the switching of the device, may cause significant amplitude and duration disturbances. If the brown-in time is too short, the disturbance may be mistakenly seen as restoration of a normal level of the supply voltage and the device may be brought back to the brown-in state, in fact making the protection ineffective.

On the other hand, imposing longer brown-in times is equivalent to imposing an enable threshold greater than the design threshold, which is not always acceptable. In fact, the monitoring function may be implemented on the voltage upstream or downstream of the rectifier bridge typically present at the input of this type of devices. In the first case, the input voltage is rectified by additional diodes and monitored directly. Since the rectified supply voltage may exceed the enable threshold only around the maximum of each half-wave, the condition may be met for a longer time only if the peak voltage increases. In the second case, the monitored voltage approaches a rippled direct voltage due to the capacitor downstream of the rectifier bridge. However, the phenomenon remains, albeit to a lesser extent, and the increasing of the brown-in time continues to affect the actual threshold.

The problem may be partially solved with a peak detector, which however involves a greater occupation of area and, in general, an increase in costs.

SUMMARY

Some embodiments provide a brown-out protection circuit for a switching converter and a method for controlling a switching converter which allow for overcoming or at least mitigating the limitations described.

Some embodiments invention find advantageous, although not exclusive, application for two-stage converters where the first stage is formed by a Boost converter which implements a Power Factor Correction (PFC) function and for Flyback single-stage converters.

BRIEF DESCRIPTION OF THE DRAWINGS

For a better understanding of the invention, some embodiments thereof will now be described, purely by way of non-limiting example, and with reference to the accompanying drawings, wherein.

DETAILED DESCRIPTION OF ILLUSTRATIVE EMBODIMENTS

Figure 1:
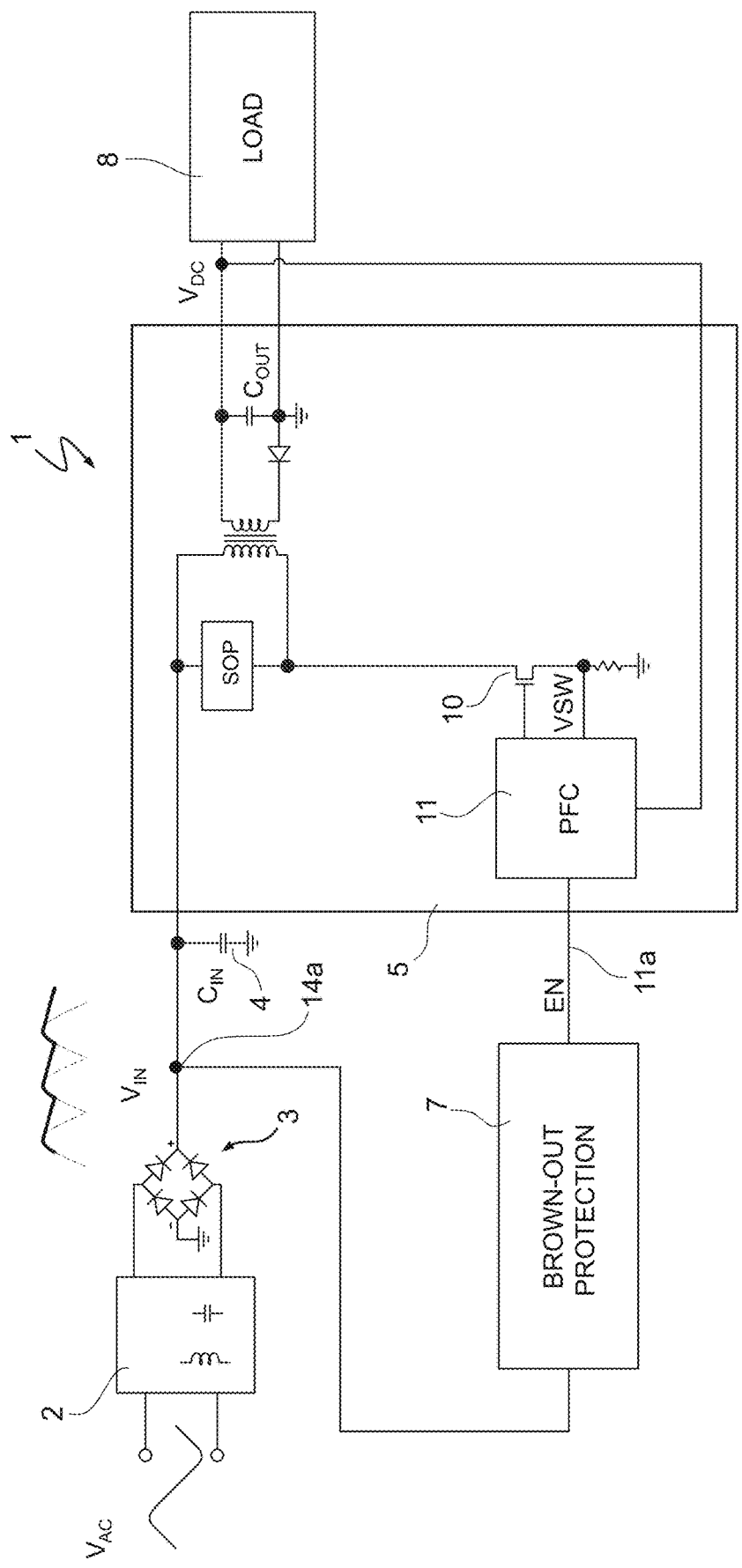
FIG. 1 is a simplified block diagram of an exemplary switching converter.

With reference to FIG. 1, an AC-DC converter is indicated in its entirety with the number 1 and comprises an input filter 2, a rectifier bridge 3, an input capacitor 4, a Flyback conversion stage 5 and a brown-out protection circuit 7. The AC-DC converter 1 supplies a load 8.

The input filter 2 receives an AC voltage VAC, for example from a distribution grid. Due to the rectifier bridge 3 and the input capacitor 4, at the input of the Flyback conversion stage 5 there is an input voltage VIN which is direct (DC) with ripple, as indicated symbolically in FIG. 1. The Flyback conversion stage 5 supplies a direct output voltage VDC of the desired level. As is usual in switching power supplies, the Flyback conversion stage 5 comprises to this end a switch 10, for example a metal-oxide semiconductor (MOS) transistor, and a control circuit 11, which supplies control voltage VSW for selectively opening and closing the switch 10. The control circuit 11 implements a power factor correction function (PFC). The PFC function may be implemented in any way known in the art.

The control circuit 11 is provided with an enable input 11a and is alternatively enabled and disabled when a logic signal with, respectively, an enable logic value and a disable logic value, is present at the enable input 11a. When the control circuit 11 is disabled, the switch 10 cannot switch and the Flyback conversion stage 5 is idle.

The brown-out protection circuit 7 is configured to supply an enable signal EN to the enable input 11a of the control circuit 11 on the basis of the value of the input voltage VIN. The enable signal EN has an enable logic value or brown-in value ENBI and a disable logic value or brown-out value ENBO. In particular, brown-out protection circuit 7 disables control circuit n following to drops of the AC voltage VAC which are considered potentially harmful to the devices supplied by the AC-DC converter 1 (the AC voltage VAC drops turn into corresponding input voltage VIN drops). When acceptable values of the AC voltage VAC are permanently restored, the brown-out protection circuit 7 enables the control circuit allowing the operation of the AC-DC converter 1.

Figure 2:
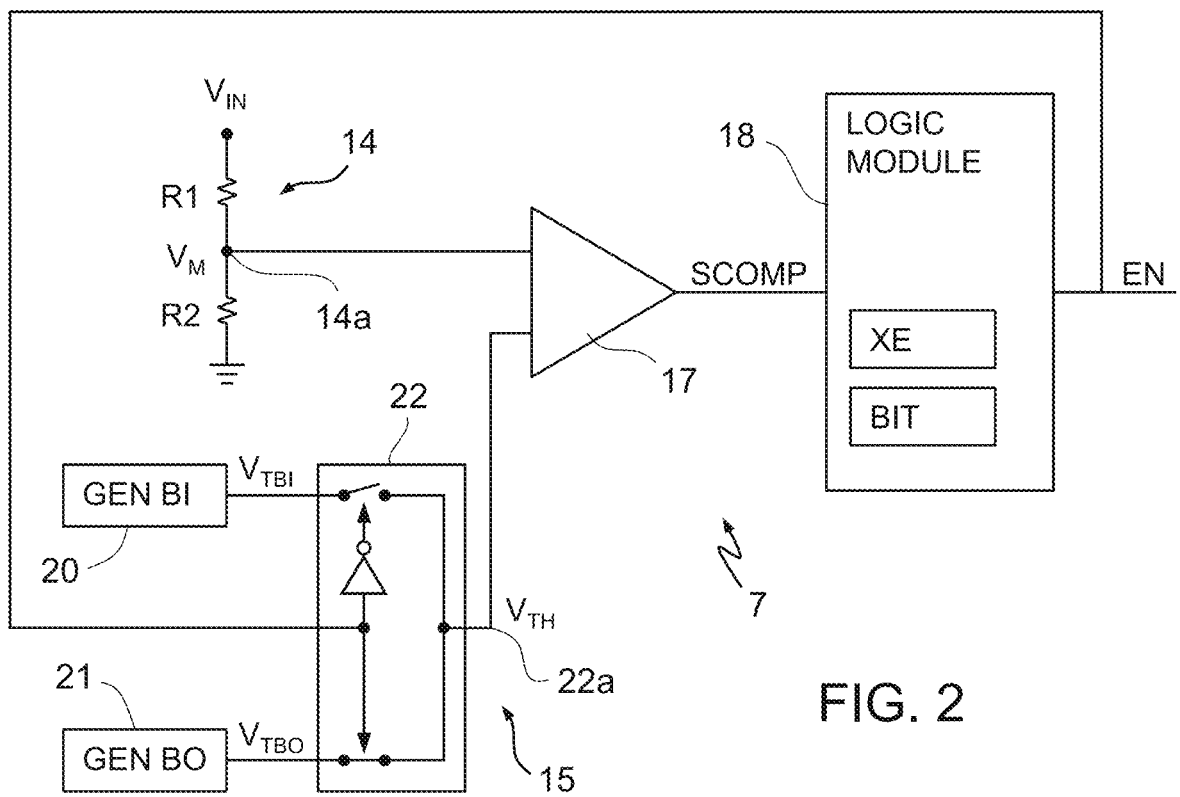
FIG. 2 is a more detailed block diagram of a brown-out protection circuit incorporated in the switching converter of FIG. 1 and embodied in accordance with an embodiment of the present invention.

In detail (FIG. 2), the brown-out protection circuit 7 comprises an input divider 14, a threshold generator stage 15, a comparator 17, and a logic module 18, which receives a clock signal CK and supplies the enable signal EN. The logic module comprises a first counter XE and a second counter BIT. The first counter XE and the second counter BIT may be implemented in any way known in the art.

The input divider 14 is coupled to the rectifier bridge 3 to receive the input voltage VIN and has a monitoring voltage VM proportional to the input voltage VIN on an intermediate node which acts as a monitoring terminal 14a.

Figure 3:
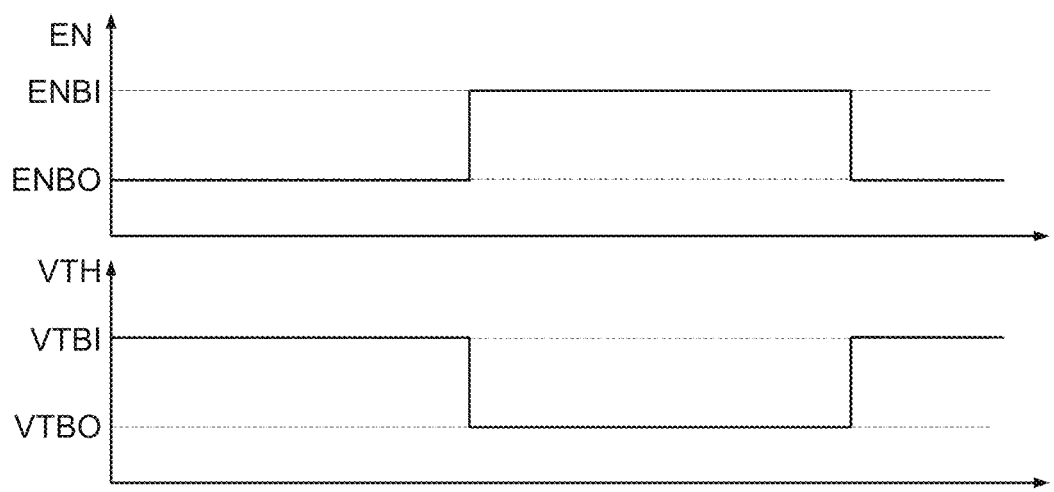
FIG. 3 is a graph showing relations between signals used in the brown-out protection circuit of FIG. 2, in accordance with an embodiment of the present invention.

The threshold generator stage 15 comprises a first threshold generator 20, supplying a brown-in threshold voltage VTBI, a second threshold generator 21, supplying a brown-out threshold voltage VTBO and a selector 22 controlled by the enable signal EN, for example a two-way selector. In particular (FIG. 3), the selector 22 supplies at an output 22a the brown-out threshold voltage VTBO, when the enable signal EN has the brown-in value ENBI, and the brown-in threshold voltage VTBI, when the enable signal EN has the brown-out value ENBO.

The comparator 17 receives the monitoring voltage VM at a first input and a threshold voltage VTH selected by the selector 22 between the brown-in threshold voltage VTBI and the brown-out threshold voltage VTBO at a second input. Furthermore, the comparator 17 generates a comparison logic signal SCOMP which has a first logic value and a second logic value when the monitoring voltage VM is greater, respectively lower, than the threshold voltage VTH selected through the selector 22.

The comparison logic signal SCOMP is supplied to the logic module 18, which generates the enable signal EN on the basis of the value of the comparison logic signal SCOMP and under conditions which will be described in detail below.

In practice, after an initialization step, the logic module 18 enables the switching of the AC-DC converter 1 if the AC voltage VAC is within an acceptable amplitude range. If the AC voltage VAC drops (for example due to a brown-out event), the logic module 18 assigns the brown-out value ENBO to the enable signal EN and disables the AC-DC converter 1 after a brown-out time TBO which depends on the characteristics and the degree of criticality of the load 8 (for example, in some embodiments, brown-out time TBO may range from 60 ms to about 700 ms depending on the applications).

Figure 4:
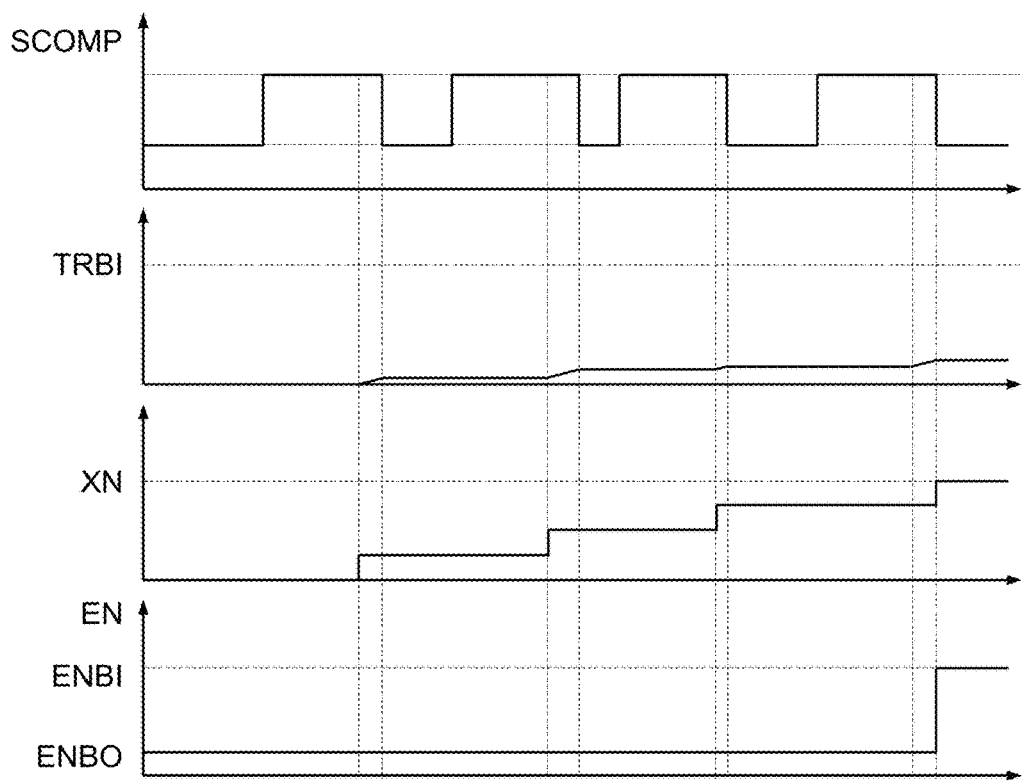
FIG. 4 is a graph showing quantities present in the brown-out protection circuit of FIG. 2 in an exemplary operation, in accordance with an embodiment of the present invention.
Figure 5:
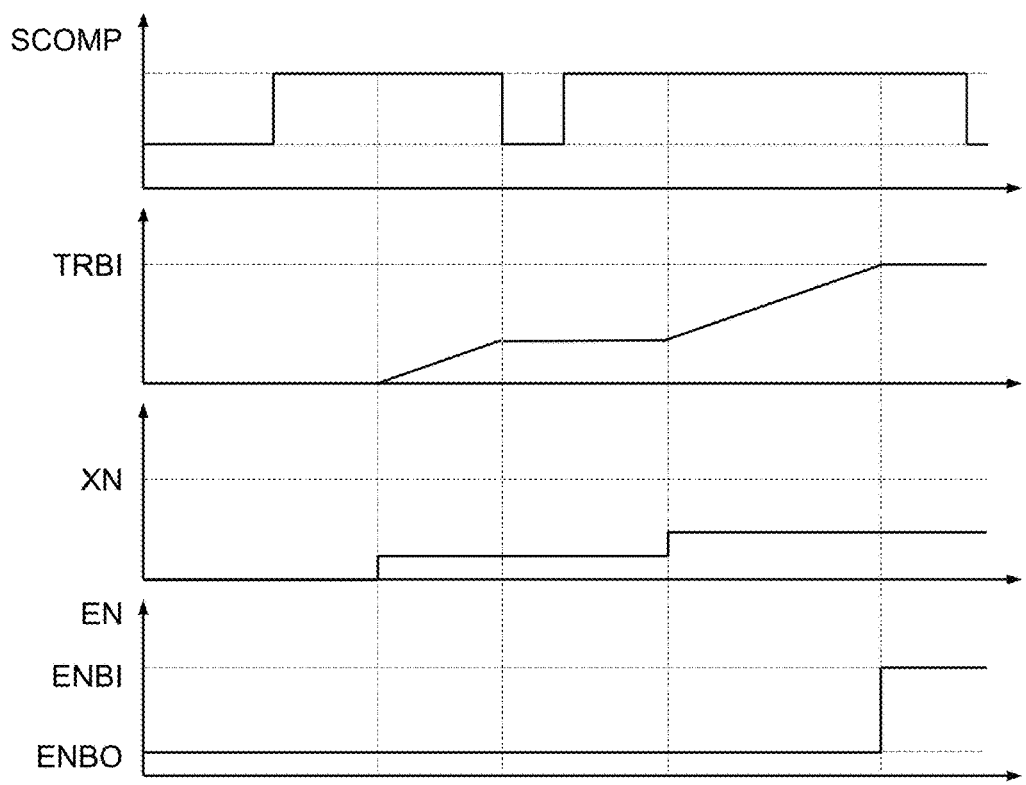
FIG. 5 is a graph showing quantities present in the brown-out protection circuit of FIG. 2 in a different exemplary operation, in accordance with an embodiment of the present invention.

When the AC-DC converter 1 is disabled, the logic module 18 assigns the brown-in value ENBI to the enable signal EN if transition conditions, which relate to the number of transitions of the comparison logic signal SCOMP from the second logic value to the first logic value during the brown-out condition, or time conditions, which relate to permanence of the comparison logic signal SCOMP at the first logic value in the brown-out condition, are met. For example, the transition conditions may be met when a number of usable transitions reaches a threshold number XN equal to at least two (four in the example of FIG. 4). A transition from the second logic value to the first logic value is considered usable if between this transition and the previous transition (from the second logic value to the first logic value) the comparison logic signal SCOMP has remained at the second logic value for a time not greater than a brown-out return time TRBO. The time conditions may be met when, in an aggregated manner following consecutive usable transitions, the comparison logic signal SCOMP remains at the first logic value for a time greater than a brown-in return time TRBI (FIG. 5). In one embodiment, both the transition conditions and the time conditions are iteratively checked and the enable signal EN is set to the brown-in value ENBI when the transition conditions or the time conditions are met (in other words, when the first of the transition conditions and the time conditions are met). In both cases, the return to and the permanence at the second logic value of the comparison logic signal SCOMP for a time greater than the brown-out return time TRBO cause the count reset of both the number of usable transitions and the time of permanence at the first logic value.

Figure 6:
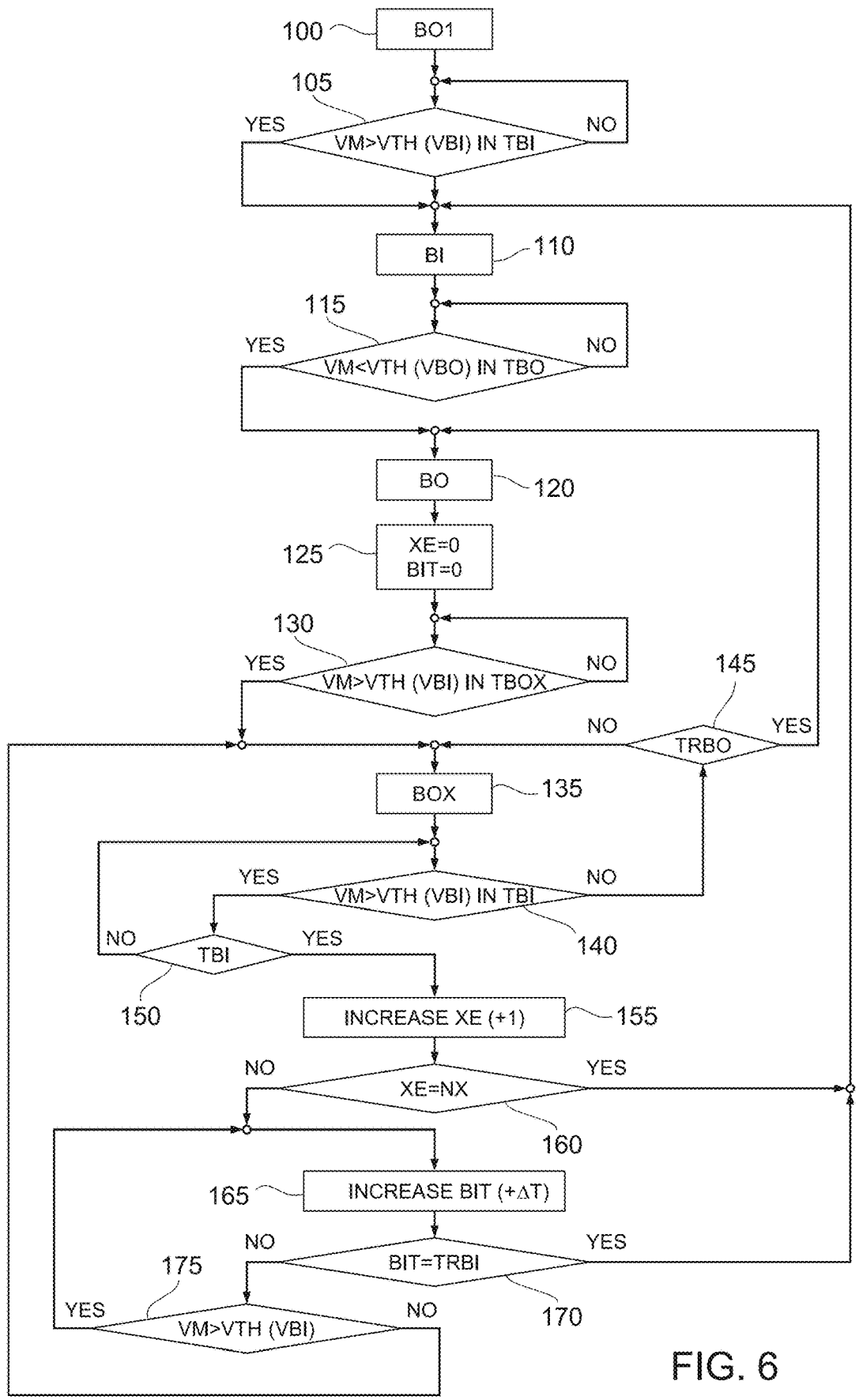
FIG. 6 is a flow chart relating to a method for controlling a switching converter implemented by the brown-out protection circuit of FIG. 2, in accordance with an embodiment of the present invention.

An example of the condition checking procedure performed by the logic module 18 will be described below with reference to FIG. 6.

Upon switching on, the AC-DC converter 1 is set to a start-up brown-out state BO1 by the logic module 18 (block 100). In the start-up brown-out state, the enable signal EN has the brown-out value ENBO and the switching of the AC-DC converter 1 is inhibited. Consequently, the selector 22 sets the threshold voltage VTH to the brown-in threshold voltage VTBI (VTH=VTBI, FIG. 2). As soon as the monitoring voltage VM exceeds the threshold voltage VTH seamlessly for a brown-in time TBI (block 105, output YES), the logic module 18 sets the AC-DC converter 1 to a brown-in state BI (block 110). This transition does not require particular caution because the switching of the AC-DC converter 1 has not yet been enabled and there are no criticalities. It is therefore advantageous that the transition occurs without any delay as soon as the AC voltage VAC and thus the monitoring voltage VM reach a level compatible with the operation of the device forming the load 8. The duration of the brown-in time TBI may be chosen according to the application, for example 500 μs. The enabling occurs upon entering the brown-in state BI: the enable signal EN is set to the enable value ENBI by the logic module 18 (FIGS. 2 and 3) and the selector 22 sets the threshold voltage to the brown-out threshold voltage VTBO (VTH=VTBO). This concludes an initiation step of the AC-DC converter 1.

When the monitoring voltage VM remains below the threshold voltage VTH seamlessly for a brown-out time TBO (block 115, output YES), the logic module 18 sets a steady brown-out state BO. Conversely, the AC-DC converter 1 remains in the brown-in state (block 115, output NO). In the steady brown-out state BO (block 120), the enable signal EN has the brown-out value ENBO and the switching of the AC-DC converter 1 is inhibited, as in the start-up brown-out state BO1.

The transition to the brown-in state is instead temporarily inhibited and is subject to the occurrence of the transition conditions or time conditions. In particular, the logic module 18 initiates (block 125) a first counter XE and a second counter BIT (FIG. 2), which contain respectively the number of usable transitions of the comparison logic signal SCOMP from the second logic value to the first logic value and the time of permanence of the comparison logic signal SCOMP at the first logic value. In one embodiment, the time of permanence is defined by the time during which the comparison logic signal SCOMP remains at the first logic value after the brown-in time TBI has elapsed since the last transition (indicating with t the time elapsed since the last transition, the time of permanence stored in the second counter is BIT=t−TBI).

If the monitoring voltage VM remains above the threshold voltage VTH (set equal to the brown-in threshold voltage VTBI by the selector 22) seamlessly for a brown-out exit time TBOX (block 130, output YES), the logic module 18 sets a brown-out exit state BOX (block 135), in which the switching of the AC-DC converter 1 is inhibited, but it is started the check of the transition conditions and the time conditions for the transition to the brown-in state, which is enabled. Conversely (block 130, output NO), the AC-DC converter 1 remains in the steady brown-out state BO. Unlike the steady brown-out state BO, in the brown-out exit state BOX the transition to the brown-in state BI is enabled. In one embodiment, the brown-out exit time TBOX may be equal to the brown-in time TBI (for example 500 μs). Different time intervals might be used, e.g., according to the design preferences.

In the brown-out exit state BOX, if the monitoring voltage VM remains below the threshold voltage VTH (block 140, output NO) seamlessly for a brown-out return time TRBO (block 145, output YES) the logic module 18 brings the AC-DC converter 1 back to the brown-out state BO (block 120). The brown-out return time TRBO may be for example 20 ms. Otherwise, if the monitoring voltage VM exceeds the threshold voltage VTH (block 140, output YES) for a time equal to the brown-in time TBI (block 150, output YES), the first counter XE is increased by one unit (block 155).

If the first counter XE has reached a transition threshold number NX (block 160, output YES), the transition conditions are met and the logic module 18 sets the AC-DC converter 1 to the brown-in state BI (block 110). Otherwise (block 160, output NO), the second counter BIT is incremented by a time increment ΔT, for example a programmed number of clock signal CK cycles (block 165). If the second counter BIT has reached a programmed brown-in return time TRBI, for example 40 ms (block 170, output YES), the time conditions are met and the logic module 18 sets the AC-DC converter 1 to the brown-in state BI (block 110). If the brown-in return time TRBI has not been reached (block 170, output NO) and the monitoring voltage VM remains above the threshold voltage VTH (block 175, output YES), the second counter BIT is incremented again (block 165). Otherwise, if the monitoring voltage VM goes below the threshold voltage VTH (block 175, output NO), the logic module 18 takes the AC-DC converter 1 back to the brown-out exit state BOX (block 135). In practice, thus, the check of the time conditions is iterated until either the brown-in return time TRBI has elapsed, and the AC-DC converter 1 returns to the brown-in state BI, or the monitoring voltage VM goes below the threshold voltage VTH, and the AC-DC converter 1 returns to the brown-out exit state BOX.

The brown-out protection circuit 7 described may advantageously be used in different configurations also in other types of AC-DC switching converters, as shown in the following non-limiting examples.

Figure 7:
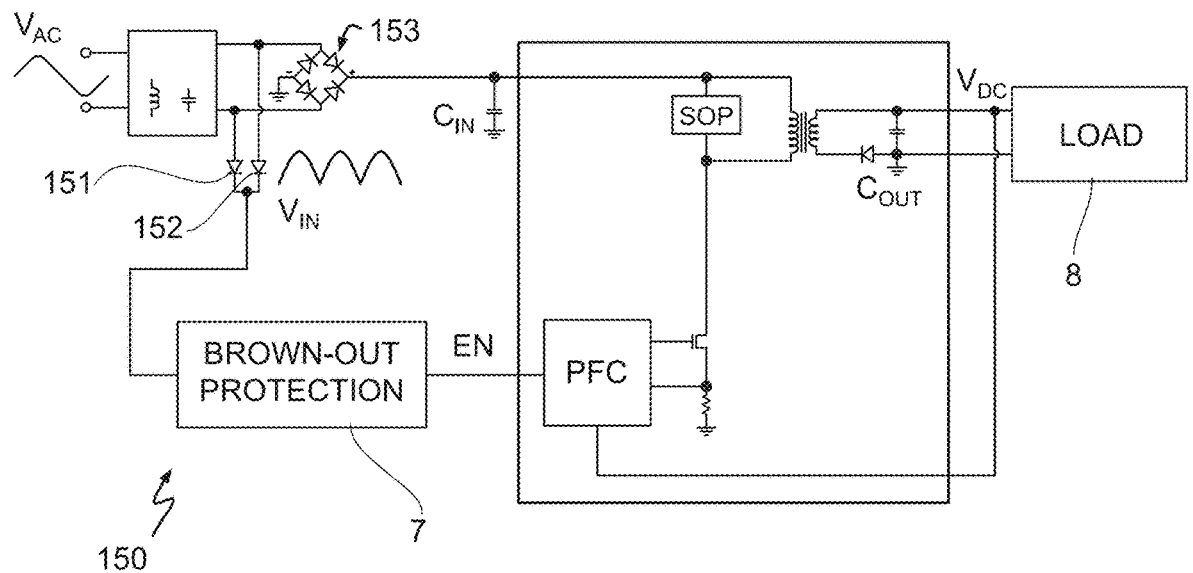
FIG. 7 is a simplified block diagram of another exemplary switching converter incorporating the brown-out protection circuit of FIG. 2, in accordance with an embodiment of the present invention.

FIG. 7 shows an AC-DC converter 150 of Flyback type in which the input voltage VIN is supplied to the brown-out protection circuit 7 through rectifier diodes 151, 152 connected upstream of the rectifier bridge, here indicated with 153. This may be convenient for example when, for security reasons, an x-cap discharge function is integrated, whose circuitry is not shown here for simplicity. In this case, the input voltage VIN is purely rectified. Nevertheless, the brown-out protection circuit 7 operates effectively due to the combined check of the transition conditions and the time conditions.

Figure 8:
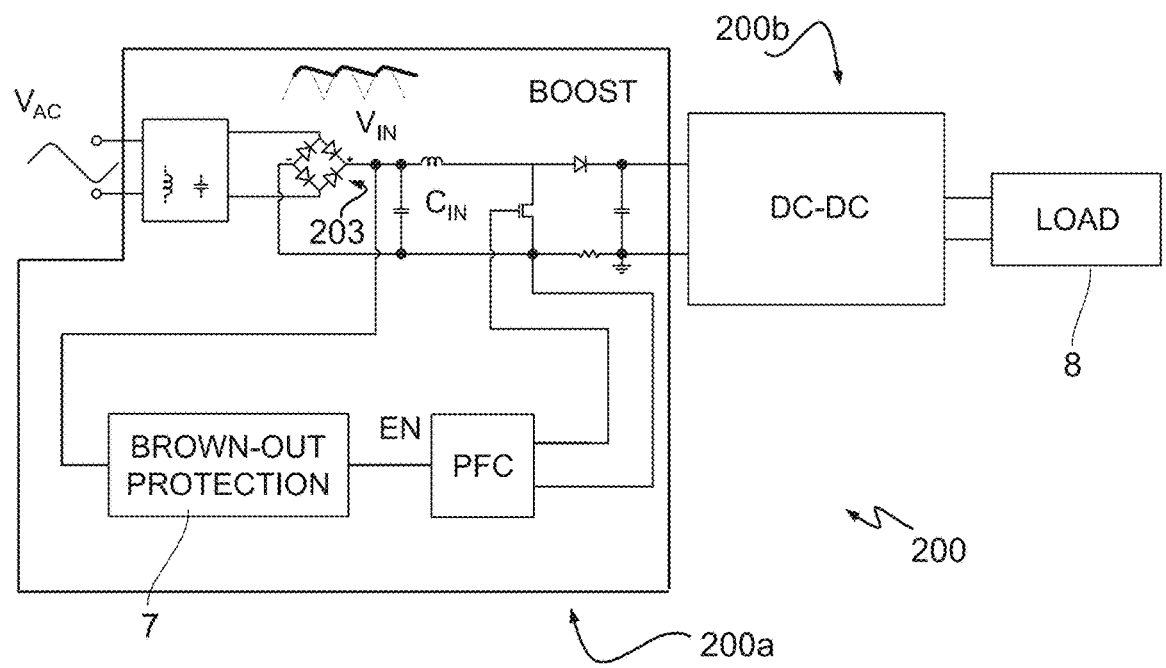
FIG. 8 is a simplified block diagram of a further exemplary switching converter incorporating the brown-out protection circuit of FIG. 2, in accordance with an embodiment of the present invention.

In the example of FIG. 8, the brown-out protection circuit 7 is integrated in a two-stage AC-DC converter 200, with a first stage 200a of boost type and a DC-DC converter as a second stage 200b. In particular, the AC-DC converter 200 is integrated in the first stage 200a and the input voltage VIN of the brown-out protection circuit 7 is taken downstream of the rectifier bridge 203.

Figure 9:
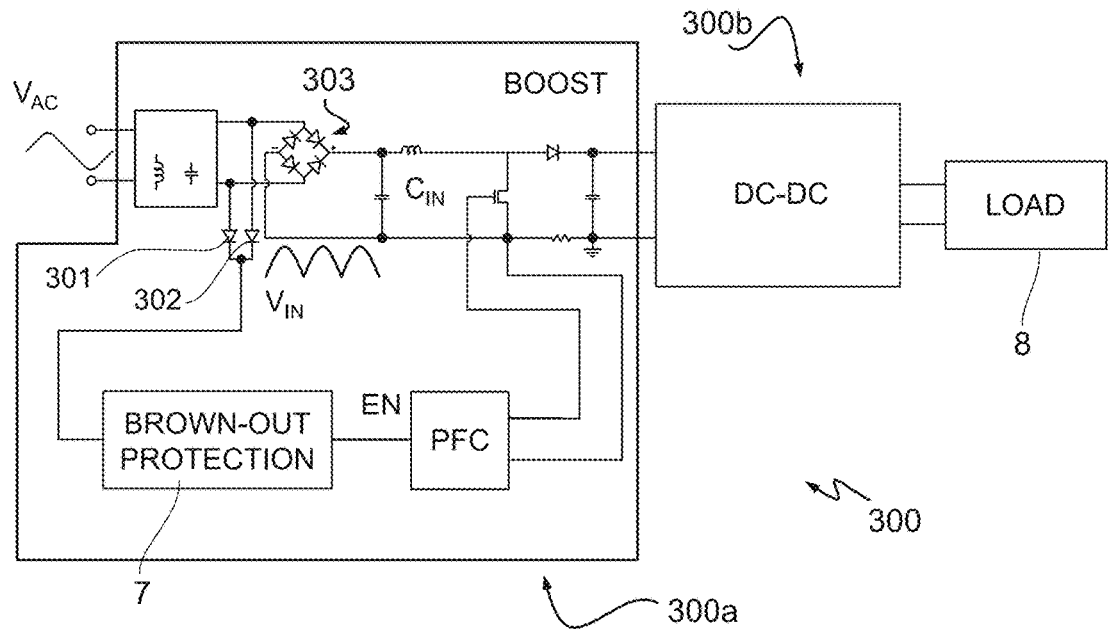
FIG. 9 is a simplified block diagram of a further exemplary switching converter, incorporating the brown-out protection circuit of FIG. 2, in accordance with an embodiment of the present invention.

FIG. 9 shows a two-stage AC-DC converter 300, with a first stage 300a of boost type and a DC-DC converter as a second stage 300b, substantially as in FIG. 8. In this case, the brown-out protection circuit 7 is integrated in the first stage 300a and receives the input voltage through rectifier diodes 301, 302 connected upstream of the rectifier bridge 303.

In practice, according to some embodiments, the logic module 18 implements a filter allowing prompt, however not too rapid, transitions from the brown-out state BO, combining the advantages that in conventional protection circuits are associated with short (negligible influence on the actual threshold) and long (protection from the disturbances due to the energy stored and released upon entering the brown-out state) brown-in return intervals, but which are mutually exclusive. In the brown-out protection circuit 7, in fact, the return to brown-in is conditioned by the fact that there are at least XN (at least two) consecutive usable transitions of the comparison logic signal SCOMP, to take the AC-DC converter 1 to the brown-out exit state BOX first and then, possibly, to the brown-in state (in the brown-out state, the usable transitions of the comparison logic signal SCOMP to the first logic value correspond to the exceeding of the brown-in threshold voltage VTBI). More precisely, the first transition triggers the check of the transition and time conditions described (i.e., it leads to the brown-out exit state BOX) and the switch to the brown-in state may only occur after further transitions, which however do not occur in case of disturbances upon entering the brown-out state. The input voltage VIN, in fact, maintains the same polarity typically for several milliseconds, for example 10 ms to 20 ms. A short brown-in time TBI does not put the protection at risk, although requiring the monitoring voltage to repeatedly return above the brown-in threshold voltage VTBI. On the other hand, since the time conditions are also checked in an aggregated manner following several consecutive usable transitions, a brown-in return time TRBI long enough to mask the disturbances (for example 40 ms) may be imposed, without this affecting the actual threshold. In fact, the time conditions may be met even if the brown-in threshold voltage VTBI is exceeded for a few milliseconds at each cycle of the AC voltage VAC.

Figure 10:
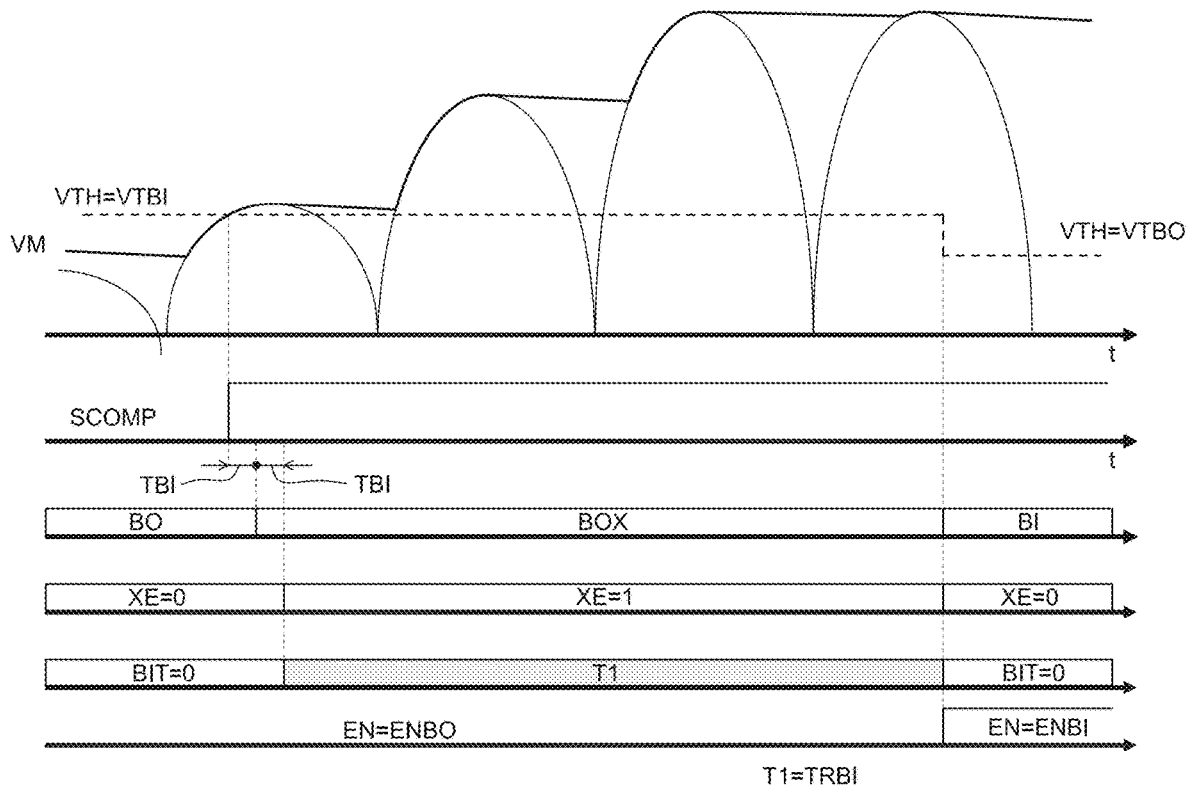
FIGS. 10-11 are graphs showing different examples of operation of the brown-out protection circuit of FIG. 2 when incorporated in the switching converter of FIG. 1 or FIG. 8, in accordance with embodiments of the present invention.
Figure 11:
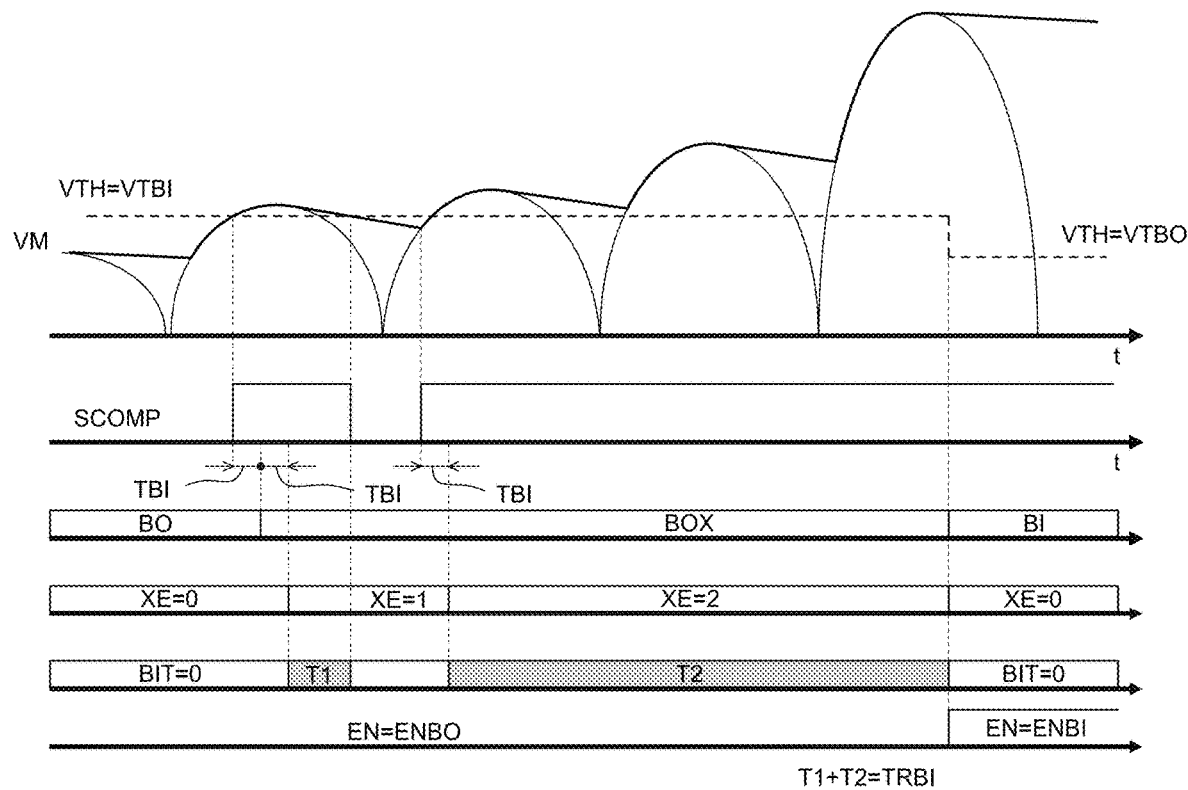
Figure 12:
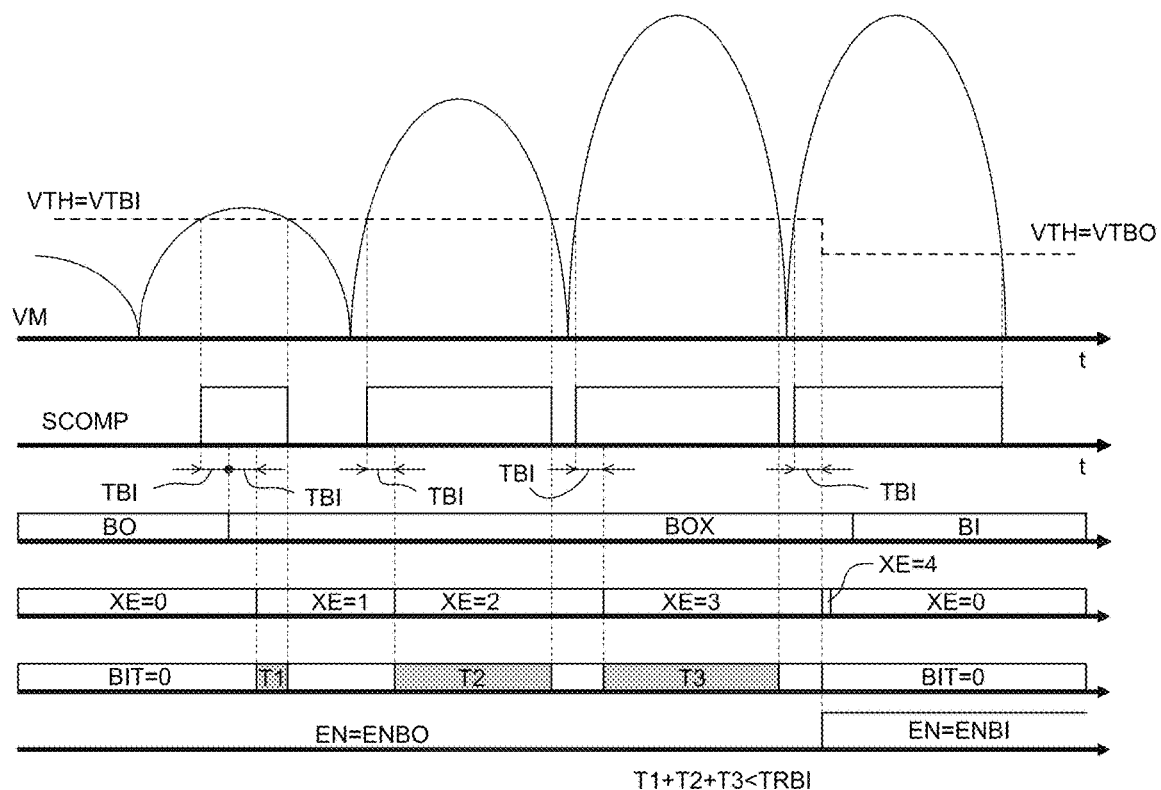
FIGS. 12-13 are graphs showing different examples of operation of the brown-out protection circuit of FIG. 2 when incorporated in the switching converter of FIG. 7 or FIG. 9, in accordance with embodiments of the present invention.
Figure 13:
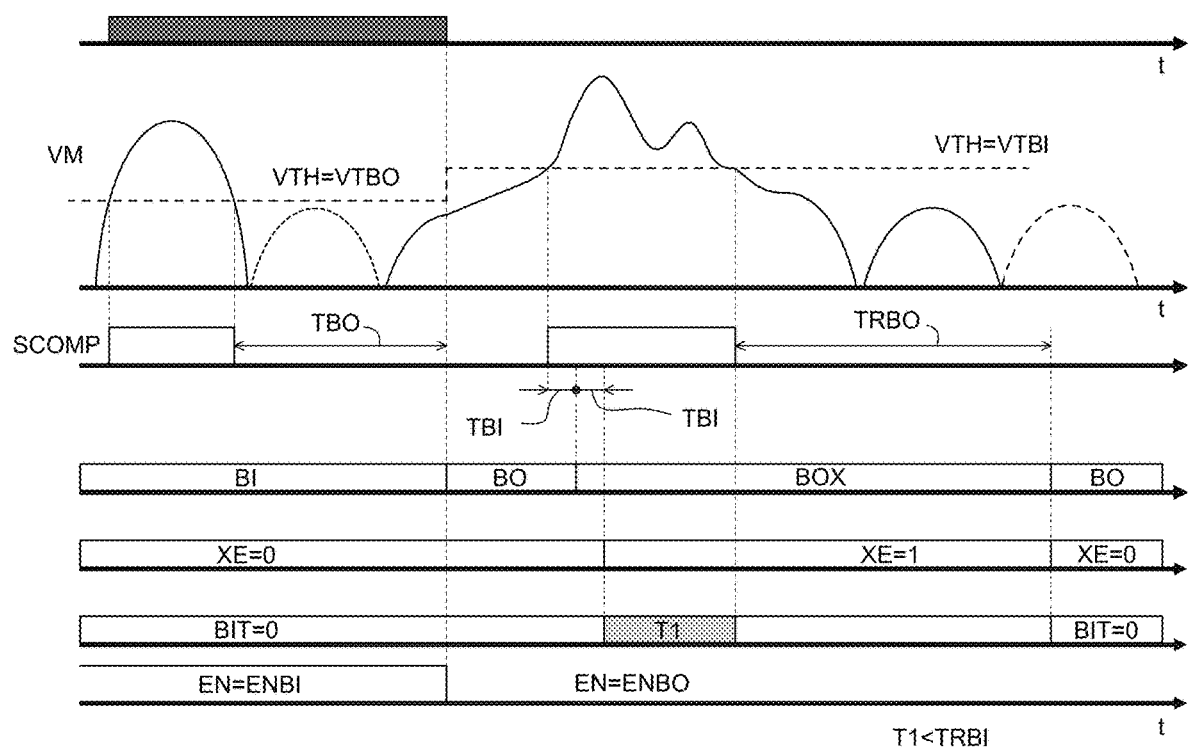

Examples are illustrated in FIGS. 10-11 (applicable to the embodiments of FIGS. 1 and 8) and 12-13 (applicable to the embodiments of FIGS. 7 and 9).

Finally, it is clear that modifications and variations may be made to the device and method described, without departing from the scope of the present invention, as defined in the attached claims.

What is claimed is:

1. A brown-out protection circuit comprising:
    a monitoring terminal;
    a threshold generator stage configured to supply a threshold voltage;
    a comparator configured to compare a monitoring voltage at the monitoring terminal and the threshold voltage; and
    a logic module configured to:
        supply an enable signal having a brown-in logic value and a brown-out logic value,
        when the enable signal is at the brown-out logic value, check transition conditions and time conditions, and
        set the enable signal to the brown-in logic value when the transition conditions or the time conditions are met, wherein the transition conditions are based on a number of usable transitions of the monitoring voltage from lower to greater than the threshold voltage, wherein the time conditions are based on a permanence time of the monitoring voltage above the threshold voltage after a usable transition of the monitoring voltage or on a sum of permanence times of the monitoring voltage above the threshold voltage after a plurality of consecutive usable transitions of the monitoring voltage, and wherein a usable transition of the monitoring voltage is a transition of the monitoring voltage separated from a previous transition of the monitoring voltage from greater to lower than the threshold voltage by a time interval not greater than a brown-out return time.

2. The circuit of claim 1, wherein the comparator is configured to supply a comparison logic signal having a first logic value when the monitoring voltage is greater than the threshold voltage, and a second logic value when the monitoring voltage is lower than the threshold voltage, and wherein the logic module is configured to identify the usable transitions of the monitoring voltage from transitions of the comparison logic signal from the second logic value to the first logic value.

3. The circuit of claim 2, wherein the logic module is configured to alternatively set:
    a brown-in state in which the enable signal is at the brown-in logic value;
    a brown-out state in which the enable signal is at the brown-out logic value and the transition to the brown-in state is disabled; and
    a brown-out exit state in which the enable signal is at the brown-out logic value and the transition to the brown-in state is enabled.

4. The circuit of claim 3, wherein the logic module is configured to switch to the brown-in state when the brown-out exit state has been set and a number of consecutive usable transitions has reached a threshold number.

5. The circuit of claim 3, wherein the logic module is configured to switch to the brown-in state when the brown-out exit state has been set and a brown-in return time has lapsed from the last usable transition.

6. The circuit of claim 3, further comprising a first counter configured to count a number of usable transitions, and a second counter configured to count a time of permanence of the comparison logic signal at the first logic value.

7. The circuit of claim 6, wherein the logic module is configured to set the enable signal to the brown-in logic value when the first counter reaches a transition threshold number or the second counter reaches a brown-in return time.

8. The circuit of claim 7, wherein the logic module is configured to increment the first counter when the brown-out exit state has been set, and a time interval equal to a brown-in time has lapsed from the last usable transition.

9. The circuit of claim 7, wherein the logic module is configured to increment the second counter iteratively after the first counter has been incremented until the monitoring voltage is greater than the threshold voltage.

10. The circuit of claim 6, wherein the logic module is configured to reset the first counter and the second counter when the brown-out state is set.

11. The circuit of claim 6, wherein the logic module is configured to set the brown-out state when the brown-in state has been set and the monitoring voltage remains lower than the threshold voltage for a time interval equal to a brown-out time or when the brown-out exit state has been set and the monitoring voltage remains lower than the threshold voltage for a time interval greater than the brown-out return time.

12. The circuit of claim 6, wherein the logic module is configured to set the brown-out exit state when the brown-out state has been set and the monitoring voltage remains greater than the threshold voltage for a time interval equal to a brown-out exit time.

13. The circuit of claim 1, wherein the threshold generator stage is configured to set the threshold voltage to a brown-out threshold voltage when the enable signal is at the brown-in logic value, and to a brown-in threshold voltage when the enable signal is at the brown-out logic value.

14. A switching converter comprising:
    a switch;
    a control circuit configured to supply a control voltage for selectively opening and closing the switch, the control circuit having an enable input configured to receive an enable signal; and
    a brown-out protection circuit comprising:
        a monitoring terminal,
        a threshold generator stage configured to supply a threshold voltage,
        a comparator configured to compare a monitoring voltage at the monitoring terminal and the threshold voltage, and
        a logic module configured to:
            supply the enable signal to the control circuit, the enable signal having a brown-in logic value and a brown-out logic value, wherein the control circuit is enabled when the enable signal is at the brown-in logic value and is disabled when the enable signal is at the brown-out logic value,
            when the enable signal is at the brown-out logic value, check transition conditions and time conditions, and
            set the enable signal to the brown-in logic value when the transition conditions or the time conditions are met, wherein the transition conditions are based on a number of usable transitions of the monitoring voltage from lower to greater than the threshold voltage, wherein the time conditions are based on a permanence time of the monitoring voltage above the threshold voltage after a usable transition of the monitoring voltage or on a sum of permanence times of the monitoring voltage above the threshold voltage after a plurality of consecutive usable transitions of the monitoring voltage, and wherein a usable transition of the monitoring voltage is a transition of the monitoring voltage separated from a previous transition of the monitoring voltage from greater to lower than the threshold voltage by a time interval not greater than a brown-out return time.

15. The switching converter of claim 14, further comprising an input filter having an input terminal configured to receive an AC voltage, and an output terminal configured to supply a filtered AC voltage, wherein the monitoring terminal is coupled to the output terminal of the input filter.

16. The switching converter of claim 15, further comprising a rectifier bridge coupled between the output terminal of the input filter and the monitoring terminal.

17. The switching converter of claim 14, further comprising a boost stage comprising the switch and the control circuit and an output terminal, and a second switching converter stage having an input coupled to the output terminal of the boost stage and an output terminal configured to be coupled to a load.

18. The switching converter of claim 17, wherein the boost stage comprises the brown-out protection circuit.

19. The switching converter of claim 14, further comprising a transformer having a primary winding coupled to the switch and a secondary winding configured to be coupled to load.

20. A method for controlling a switching converter, the method comprising:
  receiving an AC voltage at an input of the switching converter;
  converting the AC voltage into a monitoring voltage;
  comparing the monitoring voltage and a threshold voltage; and
  alternatively enabling and disabling switching of the switching converter based on the monitoring voltage and the threshold voltage, wherein alternatively enabling and disabling the switching of the switching converter comprises:
    when the switching of the switching converter is disabled,
      checking transition conditions and time conditions, and
      enabling the switching of the switching converter when the transition conditions or the time conditions are met, wherein the transition conditions are based on a number of usable transitions of the monitoring voltage from lower to greater than the threshold voltage, wherein the time conditions are based on a permanence time of the monitoring voltage above the threshold voltage after a usable transition of the monitoring voltage or on a sum of permanence times of the monitoring voltage above the threshold voltage after a plurality of consecutive usable transitions of the monitoring voltage, and wherein a usable transition of the monitoring voltage is a transition of the monitoring voltage separated from a previous transition of the monitoring voltage from greater to lower than the threshold voltage by a time interval not greater than a brown-out return time.

* * * * *